US010691270B2

(12) United States Patent
Aoshima et al.

(10) Patent No.: US 10,691,270 B2
(45) Date of Patent: Jun. 23, 2020

(54) METHOD FOR MANUFACTURING WIRING BOARD AND WIRING BOARD

(71) Applicant: FUJIKURA LTD., Tokyo (JP)

(72) Inventors: Shinsuke Aoshima, Chiba (JP); Kazutoshi Koshimizu, Chiba (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 16/066,021

(22) PCT Filed: Dec. 22, 2016

(86) PCT No.: PCT/JP2016/088411
§ 371 (c)(1),
(2) Date: Jun. 25, 2018

(87) PCT Pub. No.: WO2017/111039
PCT Pub. Date: Jun. 29, 2017

(65) Prior Publication Data
US 2019/0018521 A1 Jan. 17, 2019

(30) Foreign Application Priority Data

Dec. 24, 2015 (JP) ................. 2015-251049

(51) Int. Cl.
H05K 3/02 (2006.01)
H05K 3/10 (2006.01)
(Continued)

(52) U.S. Cl.
CPC .......... *G06F 3/044* (2013.01); *H05K 1/0225* (2013.01); *H05K 1/0296* (2013.01); *H05K 1/092* (2013.01);
(Continued)

(58) Field of Classification Search
CPC .......... G06F 3/044; G06F 2203/04107; G06F 2203/04103; H05K 3/1216; H05K 3/1275;
(Continued)

(56) References Cited

U.S. PATENT DOCUMENTS 8,530,589 B2 * 9/2013 Scher ................ C09D 11/101
438/478
8,833,923 B2 * 9/2014 Mori ................ H05K 3/1258
347/101
(Continued)

FOREIGN PATENT DOCUMENTS

CN 101330801 A 12/2008
CN 102573314 A 7/2012
(Continued)

OTHER PUBLICATIONS

Office Action issued in counterpart Japanese Patent Application No. 2017-558274 dated Feb. 5, 2019 (6 pages).
(Continued)

*Primary Examiner* — Donghai D Nguyen
(74) *Attorney, Agent, or Firm* — Osha Liang LLP

(57) ABSTRACT

A method is provided for manufacturing a wiring board that includes a conductor part including a first line and a second line wider than the first line. The method includes: a first process of forming the first line and a boundary line corresponding to at least a portion of an outline of the second line near the first line; and a second process of forming a remaining portion of the second line.

7 Claims, 13 Drawing Sheets

(51) Int. Cl.
*G06F 3/044* (2006.01)
*H05K 1/09* (2006.01)
*H05K 1/02* (2006.01)
*H05K 3/12* (2006.01)

(52) U.S. Cl.
CPC ......... *H05K 3/1216* (2013.01); *H05K 3/1241* (2013.01); *H05K 3/1275* (2013.01); *G06F 2203/04103* (2013.01); *G06F 2203/04107* (2013.01); *G06F 2203/04112* (2013.01); *H05K 2201/09681* (2013.01); *Y10T 29/49155* (2015.01)

(58) Field of Classification Search
CPC .... H05K 3/1241; H05K 1/0225; H05K 1/092; H05K 1/0296; H05K 2201/09681; Y10T 29/49155
USPC ............................................................ 29/846
See application file for complete search history.

(56) References Cited

U.S. PATENT DOCUMENTS

| | | | |
|---|---|---|---|
| 9,877,385 B2* | 1/2018 | Nakamura | H05K 1/0296 |
| 2008/0042288 A1 | 2/2008 | Yamazaki et al. | |
| 2008/0317943 A1 | 12/2008 | Hirai | |
| 2010/0289026 A1 | 11/2010 | Yamazaki et al. | |
| 2012/0154499 A1 | 6/2012 | Mori et al. | |
| 2014/0176825 A1 | 6/2014 | Lee et al. | |
| 2014/0299357 A1 | 10/2014 | Nakamura | |
| 2015/0077649 A1 | 3/2015 | Lee | |
| 2016/0070389 A1 | 3/2016 | Lee et al. | |
| 2018/0074612 A1* | 3/2018 | Shiojiri | G06F 3/044 |

FOREIGN PATENT DOCUMENTS

| | | |
|---|---|---|
| CN | 203490675 U | 3/2014 |
| CN | 103955312 A | 7/2014 |
| JP | H04-044387 A | 2/1992 |
| JP | 2004-151428 A | 5/2004 |
| JP | 2005-353738 A | 12/2005 |
| JP | 2008-033284 A | 2/2008 |
| JP | 2013-102108 A | 5/2013 |
| JP | 2013-149237 A | 8/2013 |
| JP | 2014-218009 A | 11/2014 |
| TW | 201426474 A | 7/2014 |
| TW | 201509254 A | 3/2015 |

OTHER PUBLICATIONS

Office Action issued in corresponding Taiwanese Patent Application No. 105142642 dated Nov. 21, 2017 (10 pages).

Office Action issued in corresponding Taiwanese Patent Application No. 105142642 dated Apr. 20, 2018 (6 pages).

* cited by examiner

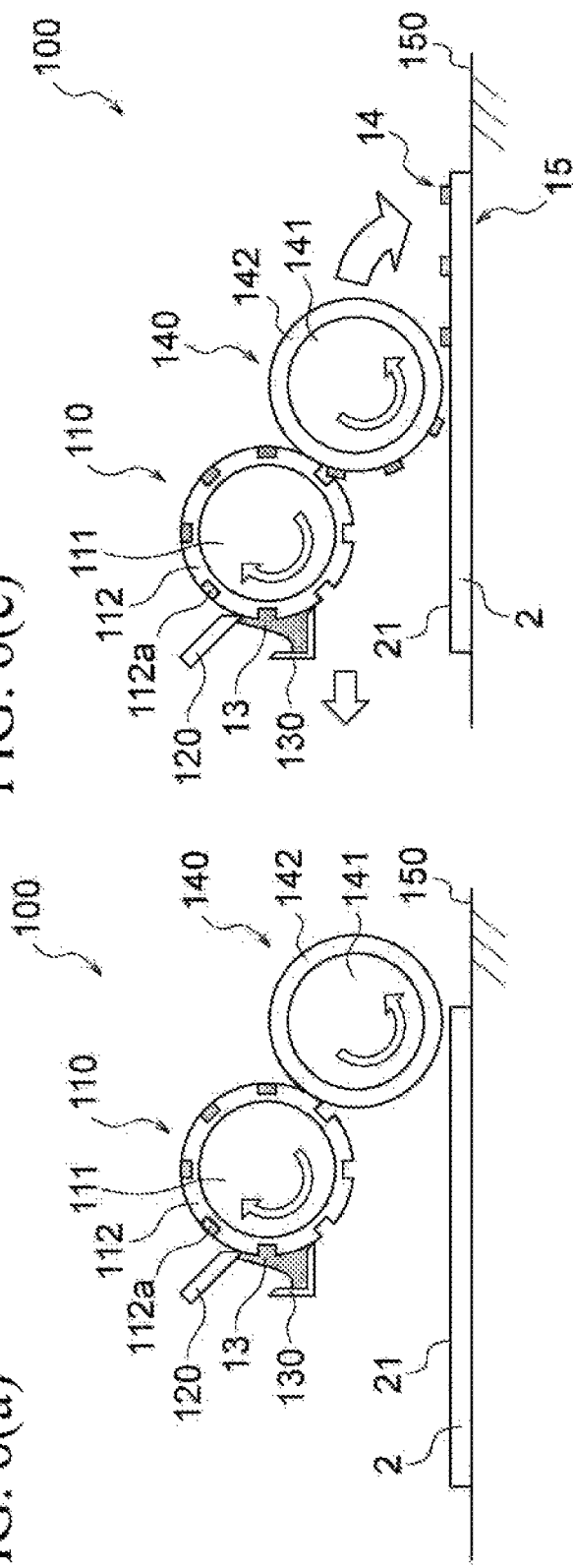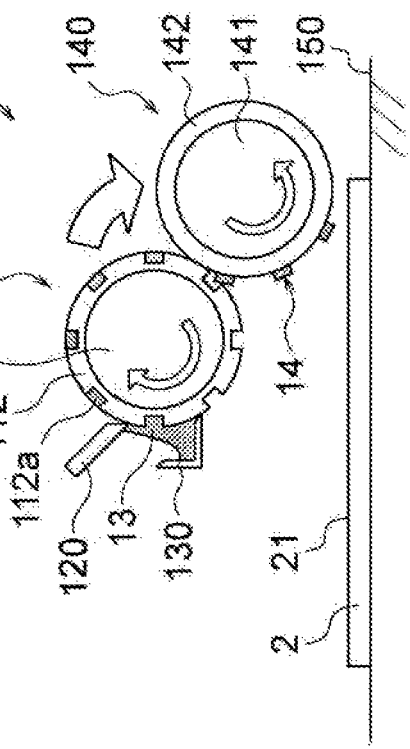

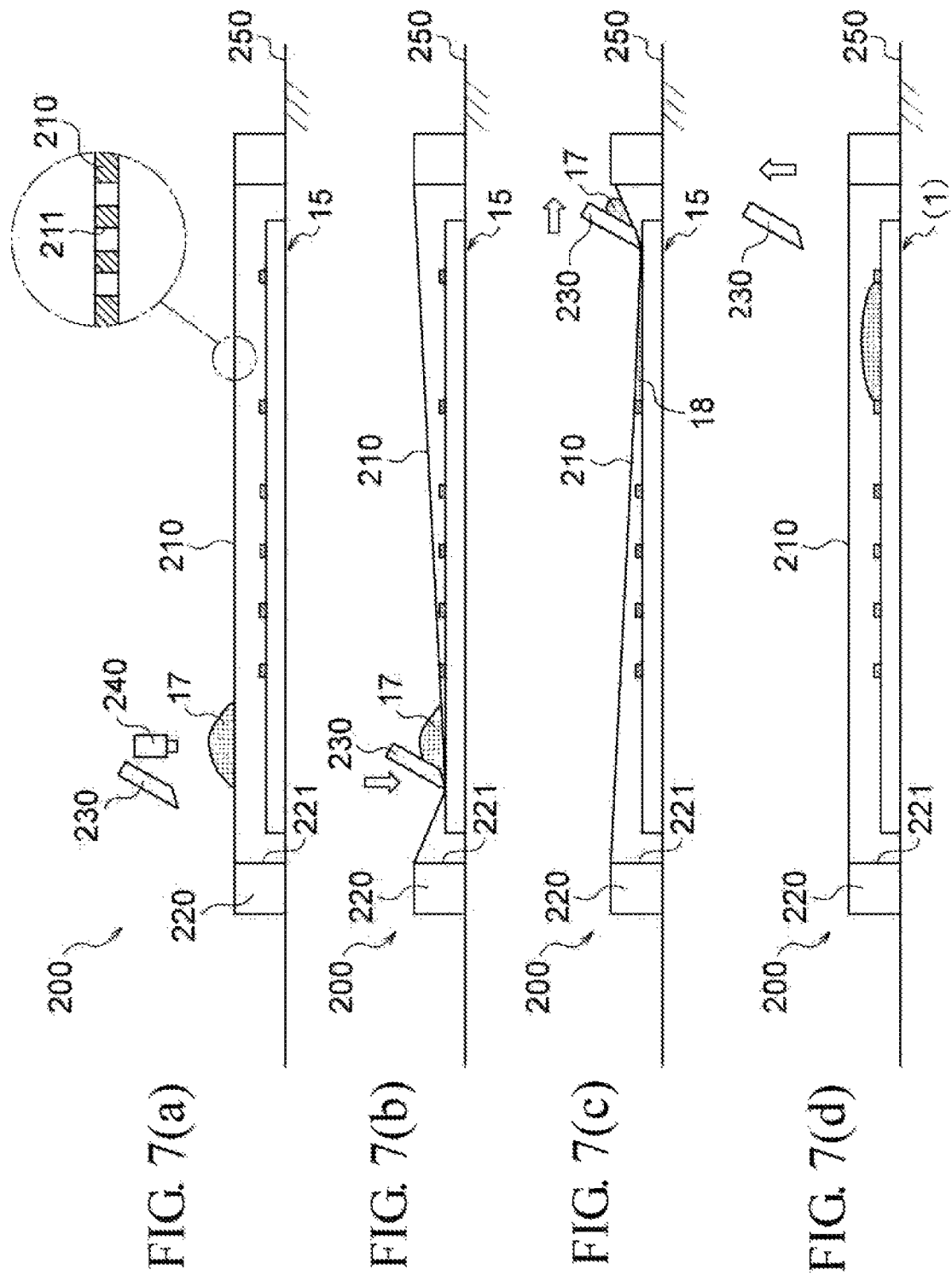

METHOD FOR MANUFACTURING WIRING BOARD AND WIRING BOARD

TECHNICAL FIELD

The present invention relates to a method of manufacturing a wiring board and a wiring board.

For designated countries where documents are permitted to be incorporated by reference, the contents described in Japanese Patent Application No. 2015-251049 filed on Dec. 24, 2015 in Japan are incorporated herein by reference, and become a part of descriptions of the present disclosure.

BACKGROUND ART

A technique for forming print patterns having different widths is known (for example, see FIG. 1 of Patent Document 1).

CITATION LIST

Patent Document

Patent Document 1: JP 2014-218009 A

In the above technique, an ink tends to blur around a wide print pattern and it may be mixed with an adjacent print pattern.

SUMMARY

One or more embodiments of the present invention provide a method of manufacturing a wiring board and a wiring board that can suppress a thick line and a fine line adjacent to each other from being mixed.

[1] A method of manufacturing a wiring board according to one or more embodiments of the present invention includes a conductor part including at least a fine line (first line) and a thick line (second line) which is wider than the fine line, the method comprising: a first process of forming the fine line and a boundary line corresponding to at least a portion of an outline of the thick line close to (or near) the fine line; and a second process of forming a remaining portion of the thick line.

[2] In one or more embodiments of the invention, the fine line, the boundary line, and the remaining portion may be formed so as to satisfy the following Formula (1):

$$H_2 < H_3 \tag{1},$$

wherein $H_2$ is a height of the boundary line and $H_3$ is a height of the remaining portion in the Formula (1).

[3] In one or more embodiments of the above invention, the second process may include overlapping a part of the remaining portion of the thick line with the boundary line in plan view.

[4] In one or more embodiments of the above invention, the boundary line may correspond to the whole of the outline.

[5] In one or more embodiments of the above invention, the first process may include forming the fine line and the boundary line so as to satisfy the following Formula (2):

$$W_1 < W_2 \tag{2},$$

and wherein $W_1$ is a width of the fine line and $W_2$ is a width of the boundary line in the Formula (2).

[6] In one or more embodiments of the above invention, the boundary line may include linear patterns extending adjacent to each other.

[7] In one or more embodiments of the above invention, the thick line may include a mesh portion surrounded by the outline and formed into a mesh shape, and wherein the method of manufacturing the wiring board includes forming the mesh portion before the second process.

[8] A wiring board according to one or more embodiments of the present invention comprises a conductor part including at least a fine line and a thick line wider than the fine line, wherein the thick line includes: a main body portion made of a material having a composition different from a composition of a material forming the fine line; and a boundary line made of a material having the same composition as the composition of the material forming the fine line, wherein the boundary line is formed to correspond to at least a portion of an outline of the thick line close to the fine line.

[9] In one or more embodiments of the above invention, an electrical resistance of the material forming the main body portion may be relatively higher than an electric resistance of the material forming the fine line.

[10] In one or more embodiments of the above invention, the following Formula (3) may be satisfied:

$$H_2 < H_3 \tag{3},$$

and wherein, $H_2$ is a height of the boundary line, and $H_3$ is a height of the main body portion in the Formula (3).

[11] In one or more embodiments of the above invention, the boundary line and a part of the main body portion may overlap with each other in the plan view.

[12] In one or more embodiments of the above invention, the boundary line may correspond to the whole of the outline.

[13] In one or more embodiments of the above invention, the following Formula (4) may be satisfied:

$$W_1 < W_2 \tag{4},$$

and wherein, $W_1$ is a width of the fine line and $W_2$ is a width of the boundary line in the Formula (4).

[14] In one or more embodiments of the above invention, the boundary line may include linear patterns extending adjacent with each other.

[15] In one or more embodiments of the above invention, the thick line may further include a mesh portion surrounded by the outline and formed into a mesh shape, and wherein the mesh portion is made of a material having the same composition as the composition of the material forming the fine line.

In the method of manufacturing the wiring substrate and the wiring substrate according to one or more embodiments of the present invention, the boundary line is formed to correspond to at least a portion of an outline of the thick line close to the fine line. Thereby, it is possible to suppress the thick line and the fine line adjacent to each other from being mixed.

BRIEF DESCRIPTION OF DRAWINGS

FIGS. 6(a) to 6(c) are side views for explaining a first printing process according to one or more embodiments of the present invention;

FIGS. 7(a) to 7(d) are side views for explaining a second printing process according to one or more embodiments of the present invention;

MODE(S) FOR CARRYING OUT THE INVENTION

Figure 1:
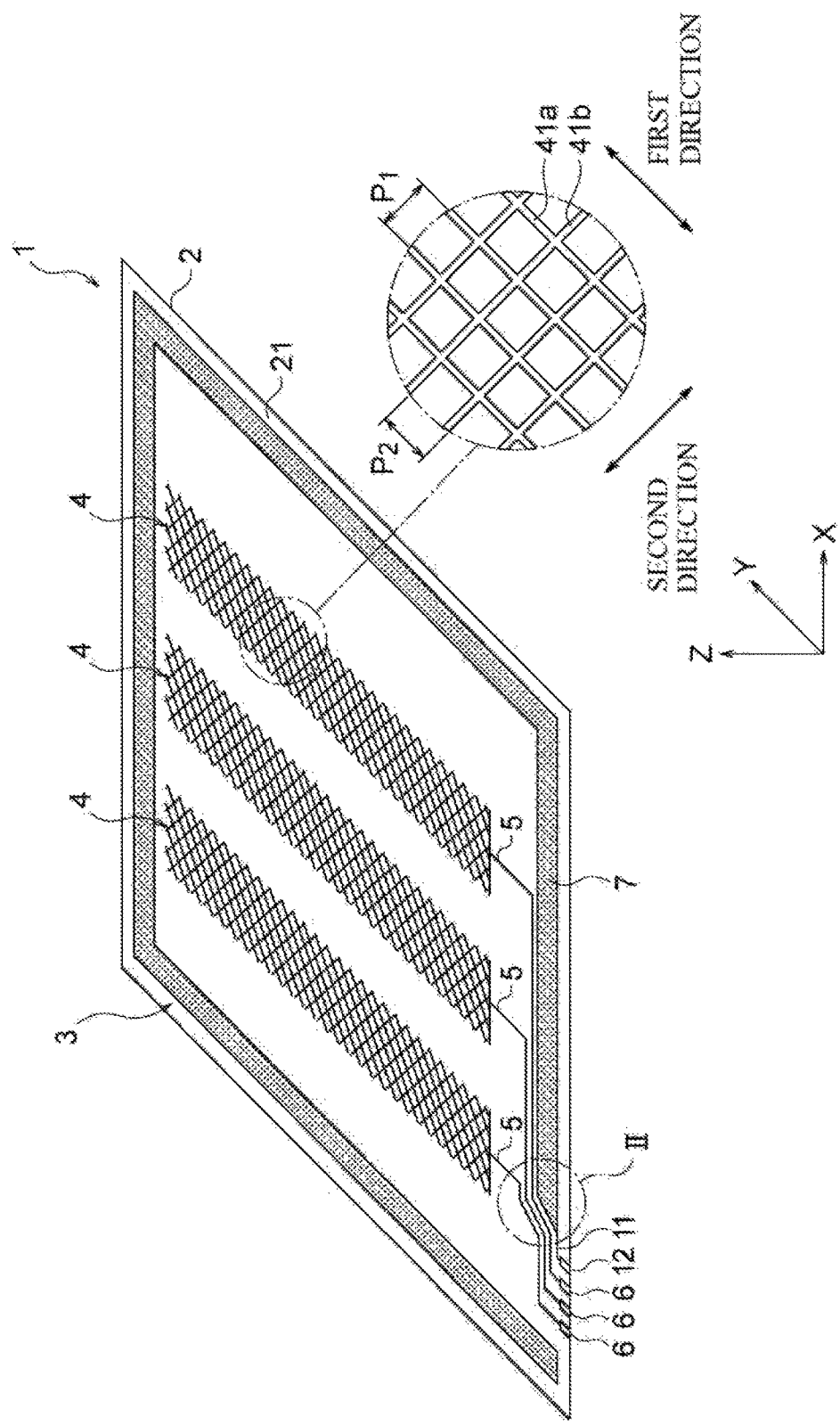
FIG. 1 is a perspective view illustrating a wiring board according to one or more embodiments of the present invention.

Embodiments of the present invention will be described below with reference to the drawings. In the drawings used in the following description, a main part may be enlarged for the sake of convenience in order to make the features of the present invention easy to understand, and dimensional ratios of the respective components are not limited to those of the actual components.

Figure 2:
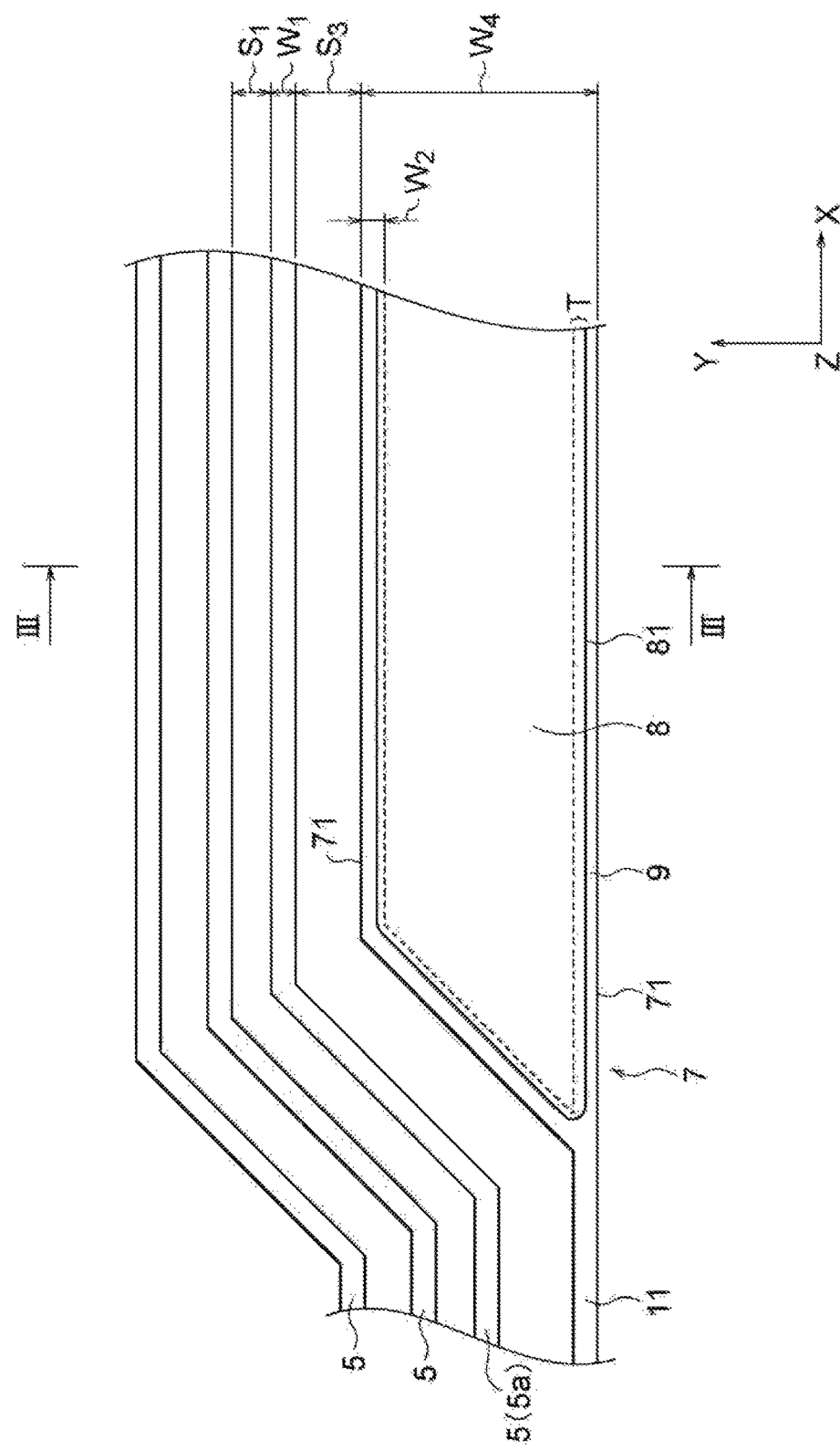
FIG. 2 is a partially enlarged view of a portion II in FIG. 1.
Figure 3:
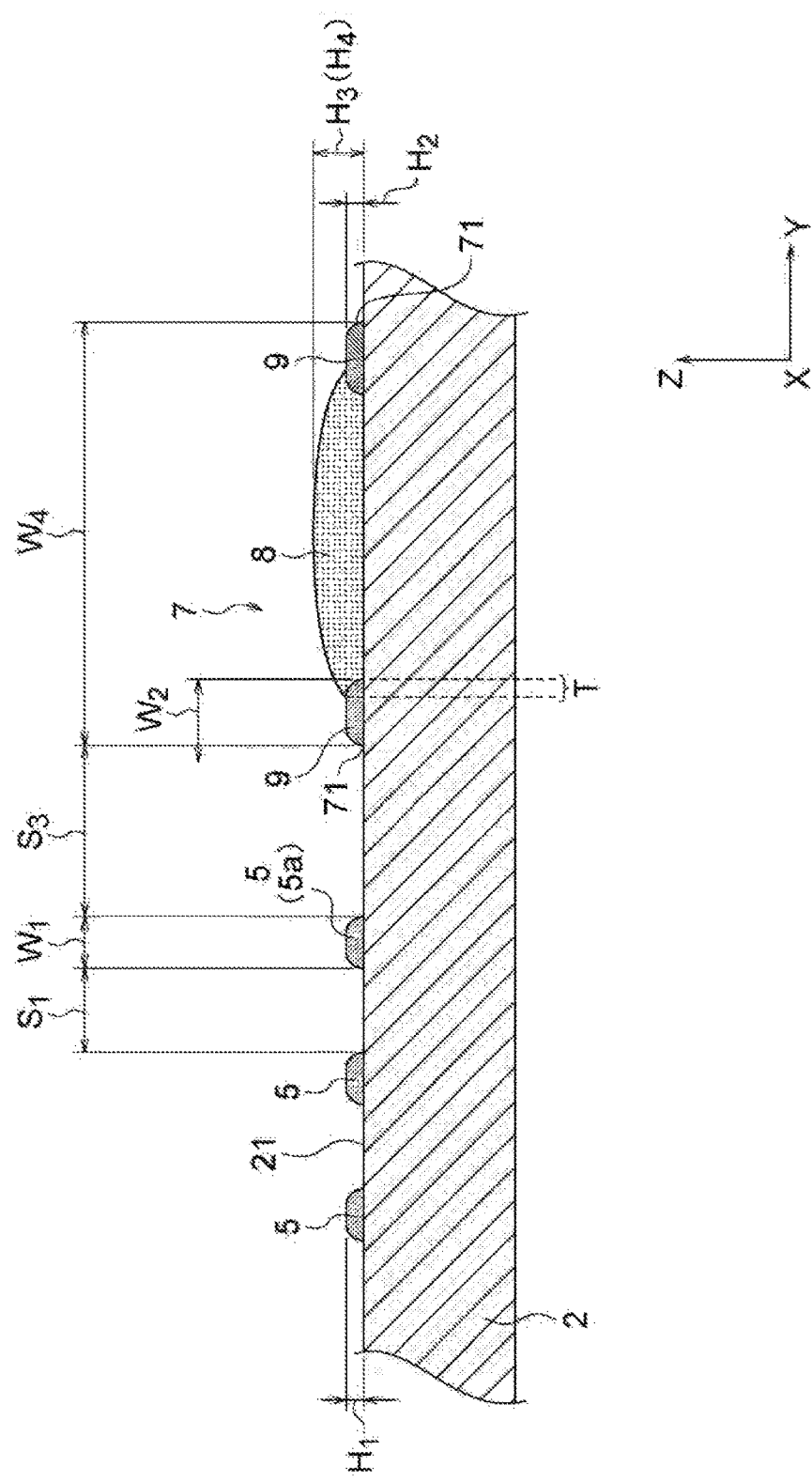
FIG. 3 is a cross-sectional view taken along a line III-III of FIG. 2.
Figure 4:
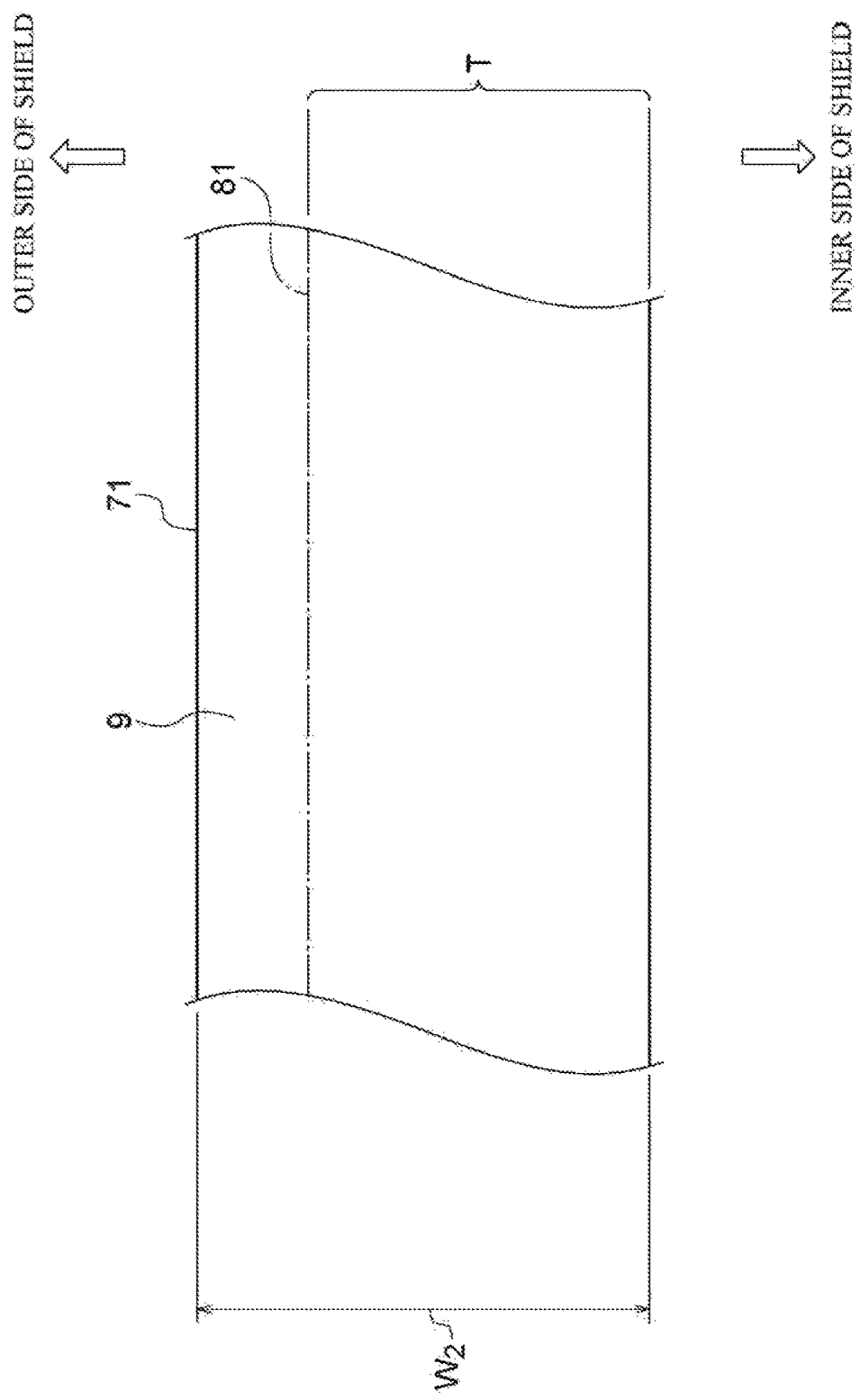
FIG. 4 is a plan view for explaining a positional relationship between a boundary line and a main body portion according to one or more embodiments of the present invention.

FIG. 1 is a perspective view illustrating a wiring board according to one or more embodiments of the present invention, FIG. 2 is a partially enlarged view of a II portion of FIG. 1, FIG. 3 is a sectional view taken along a line III-III of FIG. 2, and FIG. 4 is a plan view for illustrating the positional relationship between the boundary line and the main body portion according to one or more embodiments of the present invention.

A wiring board 1 in one or more embodiments is used, for example, as a membrane wiring plate of a touch panel. In such a touch panel, for example, when an operator's finger (an external conductor) approaches a touch electrode (an electrode 4), an electrostatic capacitance of the touch electrode changes. The touch panel can detect a touch position by detecting this change. Further, use of the wiring board 1 is not particularly limited to the aforementioned use. The "wiring board 1" corresponds to an example of the "wiring board" in one or more embodiments of the present invention.

As illustrated in FIG. 1, the wiring board 1 includes a base 2 and a conductor part 3 formed on the base 2. The "conductor part 3" corresponds to an example of the "conductor part" in one or more embodiments of the present invention.

The base 2 is made of a film having an insulation property. Examples of material forming the base 2 may include polyethylene terephthalate (PET), polyethylene naphthalate (PEN), polyimide resin (PI), polyetherimide resin (PEI) and the like. When the wiring board 1 is used for a touch panel, a transparent material having plasticity is selected as a material the base 2. Instead of a resin material, the base may be made of, for example, glass.

On an upper surface 21 of the base 2, a conductor part 3 is formed. As illustrated in FIG. 1, the conductor part 3 includes a plurality of electrodes 4, a plurality of lead wires 5, a plurality of terminals 6, and a shield 7. The "lead wire 5" corresponds to an example of the "fine line" in one or more embodiments of the present invention, and the "shield 7" corresponds to an example of the "thick line" in one or more embodiments of the present invention.

The number of the electrodes 4 included in the conductor part 3 is not particularly limited but may be arbitrarily set. The number of the lead wire 5 and the number of the terminal 6 included in the conductor part 3 are set according to the number of electrodes 4.

Each of the electrodes 4 extends in the Y direction in FIG. 1. As illustrated in the enlarged view of FIG. 1, the electrode 4 of one or more embodiments has a mesh shape formed by intersecting a plurality of electrode fine wires 41a and 41b in order to provide a translucency. The electrode fine wire 41a extends linearly in a direction (hereinafter, also referred to as a "first direction") inclined by +45° with respect to the X direction. The plurality of electrode fine wires 41a are arranged at an equal pitch $P_1$ in a direction (hereinafter, also referred to as a "second direction") orthogonal to the first direction. In contrast, the electrode fine wire 41b extends linearly in the second direction, and a plurality of the electrode fine wires 41b are arranged an equal pitch $P_2$ in the first direction. Since the electrode fine wires 41a and 41b are orthogonal to each other, the electrodes 4 are formed in the mesh shape where a rectangular mesh is repeated.

A configuration of the electrodes 4 is not particularly limited to the aforementioned configuration. For example, the pitch $P_1$ of the electrode fine wires 41a and the pitch $P_2$ of the electrode fine wires 41b are made equal to each other in one or more embodiments to form a square unit mesh ($P_1=P_2$), but the pitch $P_1$ of the electrode fine wires 41a and the pitch $P_2$ of the electrode fine wires 41b may be made different ($P_1 \neq P_2$).

Further, the shape of the mesh-shaped electrodes 4 is not particularly limited to the aforementioned shape, but may be a shape of a triangle such as an equilateral triangle, an isosceles triangle and a right triangle or a quadrangle such as a parallelogram or a trapezoid. Further, the shape of the mesh may be an n-polygon such as a hexagon, an octagon, a dodecagon and an icosagon, a circle, an ellipse, a star or the like.

Further, the electrode fine wire 41 (collectively referring to the electrode fine wires 41a and 41b) has a shape of a straight line in one or more embodiments, but the shape is not limited thereto and may be a shape of a curve, a horseshoe, a zigzag line, or the like as long as the electrode fine wire 41 extends linearly.

The configuration of the electrode 4 is not particularly limited to the aforementioned configuration, it may be a beta pattern uniformly formed on an electrode formation region. In a case where the electrode is formed in the beta pattern, the electrode is not particularly limited but is, for example, a transparent electrode including indium oxide (ITO) or a conductive polymer.

The lead wire 5 of one or more embodiments is drawn out from one end of the electrode 4 in the −X direction. The terminal 6 is provided at the other end of the lead wire 5. The terminal 6 is electrically connected to an external circuit. Each lead wire 5 is disposed on the base 2 while bending between the corresponding electrode 4 and the terminal 6.

As illustrated in FIG. 1 and FIG. 2, the plurality of lead wires 5 drawn out from the plurality of electrodes 4 are gathered so as to be substantially parallel to each other. Gaps are formed between adjacent lead wires 5 in order to ensure mutual insulation. In one or more embodiments, the gaps between adjacent lead wires 5 are formed at an equal interval. The present invention is not limited to the aforementioned configuration, and different intervals may be mixed between adjacent lead wires 5.

The width $W_1$ of the lead wire 5 is not particularly limited but is set within a range of 30 to 100 μm. A height $H_1$ of the lead wire 5 is not particularly limited, but is set within a range of 1 to 10 μm (see FIG. 3). A width $S_1$ of the gap between the adjacent lead wires 5 is set in a range of 30 to 100 μm but is not particularly limited thereto. The "width" of the lead wire 5 refers to a length of the lead wire 5 in the direction orthogonal to an extending direction of the lead wire 5 in plan view.

As illustrated in FIG. 1, the shield 7 is provided along a peripheral portion of the base 2, and surrounds the electrode 4 in plan view. The shield 7 has a function of electromagnetically shielding the electrode 4 from the outside.

As illustrated in FIG. 1, a region where the shield 7 is not formed exists on one end of the wiring board 1 in the X direction, and the terminals 6 are arranged collectively in this region. The shield 7 is grounded to the outside via a shield lead wire 11 and a shield terminal 12. The shield lead wire 11 has the same configuration as the lead wire 5, and the shield terminal 12 has the same configuration as the terminal 6.

In the portion illustrated in FIGS. 2 and 3, the shield 7 is provided side by side with the plurality of lead wires 5. The shield 7 is formed to be wide compared to the lead wire 5, and extends with a substantially constant width. In the vicinity of a connection portion (one end of the shield 7) where the shield 7 and the shield lead wire 11 are connected to each other, a width of the shield 7 gradually narrows toward the connection portion in an extending direction of the shield 7. The plurality of lead wires 5 juxtaposed to the shield 7 are bent along an outline 71 of the shield 7.

As described above, a width $W_4$ of the shield 7 is wide compared to the width $W_1$ of the lead wire 5. Specifically, width $W_4$ is set within a range of 0.5 to 3 mm from the viewpoint of exhibiting a sufficient shielding performance with respect to the electrode 4, the lead wire 5, and the terminal 6.

The shield 7 and the lead wire 5 are spaced apart from each other in order to achieve electrical insulation therebetween. In this case, a width $S_3$ of an interval between the shield 7 and the lead wire 5 (a lead wire 5a closest to the shield 7) in the plan view is set within a range of 30 to 100 μm.

The shield 7 of one or more embodiments includes a main body portion 8 and a boundary line 9. The "main body portion 8" corresponds to an example of the "main body portion" in one or more embodiments of the present invention, and the "boundary line 9" corresponds to an example of the "boundary line" in one or more embodiments of the present invention.

The boundary line 9 is formed of a single linear pattern. The boundary line 9 is continuously formed corresponding to the whole of the outline 71 of the shield 7 in the plan view, and extends with a substantially constant width in an extending direction of the boundary line 9. In the shield 7 of one or more embodiments, an outer side portion of the boundary line 9 forms the entire outline 71 of the shield 7. The "outer side portion of the boundary line 9" refers to a side portion on a side opposite to a center axis side of the shield 7 with reference to a center of the boundary line 9 in the plan view. On the other hand, an "inner side portion of the boundary line 9" refers to a side portion on the central axis side of the shield 7 with reference to the center of the boundary line 9 in the plan view.

The width $W_2$ of the boundary line 9 is set within a range of 100 to 300 μm. Further, in the wiring board 1 of one or more embodiments, a relationship between the width $W_2$ of the boundary line 9 and the width $W_1$ of the lead wire 5 is set so as to satisfy the following Formula (5).

$$W_1 < W_2 \tag{5}$$

The height $H_2$ of the boundary line 9 is set within the range of 1 to 10 μm. For this case, in a relationship between the height $H_2$ of the boundary line 9 and the height $H_1$ of the lead wire 5, height $H_2$ of the boundary line 9 may be relatively large compared to the height $H_1$ of the lead wire 5 ($H_2 > H_1$) or the height $H_2$ of the boundary line 9 may be relatively small compared to the height $H_1$ of the lead wire 5 ($H_2 < H_1$). Alternatively, the height $H_2$ of the boundary line 9 and the height $H_1$ of lead wire 5 may be equal to each other ($H_2 = H_1$).

The main body portion 8 forms the inner side of the boundary line 9 of the shield 7 in the plan view. The main body portion 8 is formed so as to overlap a part of the boundary line 9 in the plan view. In this case, as illustrated in FIG. 4, an outline 81 of the main body portion 8 is located at an inner side compared to the outline 71 of the shield 7 and is located at an outer side compared to the inner side portion of the boundary line 9 in the plan view. Since the boundary line 9 and the main body portion 8 are formed so as to overlap with each other in the plan view, they are electrically connected to each other.

A length of an overlapping portion T where the main body portion 8 and the boundary line 9 overlap with each other may be set in a range of 1 μm to 150 μm. The length of the overlapping portion T refers to a length of a portion where the main body portion 8 and the boundary line 9 overlap each other in a direction orthogonal to the extending direction of the boundary line 9 in the plan view.

As illustrated in FIG. 3, the height $H_3$ of the main body portion 8 is set in the range of 3 to 20 μm. A relationship between the height $H_3$ of the main body portion 8 and the height $H_2$ of the boundary line 9 is set so as to satisfy the following Formula (6).

$$H_2 < H_3 \tag{6}$$

Thus, as illustrated in the Formula (6), the height $H_3$ of the main body portion 8 is large compared to the height $H_2$ of the boundary line 9 in one or more embodiments. Accordingly, the height $H_4$ of the shield 7 corresponds to the height $H_3$ of the main body portion 8. Thus, since the height $H_3$ of the main body portion 8 is relatively large compared to the height $H_2$ of the boundary line 9, the shield 7 can suppress an occurrence of pinholes even in an environment with a large temperature change. In addition, since a relatively large conduction path can be secured in the main body portion 8, conductivity of the shield 7 can be improved.

Further, as illustrated in FIG. 3, the height $H_3$ of the shield 7 is larger than the height $H_1$ of the lead wire 5 ($H_1 < H_3$) in one or more embodiments. Thus, since the shield 7 is formed so as to reach a position higher than the lead wire 5, a function of electromagnetically shielding from an outer side is improved.

The material forming the boundary line 9 of the shield 7 is made of a material having the same composition as that of the material forming the lead wire 5. In one or more embodiments, the materials forming the electrode 4, the terminal 6, the shield lead wire 11, and the shield terminal 12 have also the same composition as the material forming the lead wire 5 (the boundary line 9).

On the other hand, the material forming the main body portion 8 of the shield 7 has a composition different from that of the material forming the lead wire 5. In this case, the material forming the lead wire 5 is a material having a relatively low electric resistance (high conductivity) compared to the material forming the main body portion 8 in one or more embodiments.

Specifically, examples of the material forming the lead wire 5 may include a conductive material including conductive particles such as silver (Ag) having a particle diameter set within a range of 1 to 10 μm and a binder resin such as acrylic resin, polyester resin, epoxy resin, vinyl resin, urethane resin, phenol resin, and polyimide resin.

The particle diameters of the conductive particles can be obtained by using a scanning electron microscope (SEM) or a transmission electron microscope (TEM). Specifically, an arithmetic mean value of the particle diameters of a plurality of the conductive particles measured by SEM or TEM is taken as the particle diameter of the conductive particles. When a shape of the conductive particle is a shape of an ellipsoid having a short diameter and a long diameter, a rod, or a shape including concept of an aspect ratio, a side (or a diameter) in a longitudinal direction is measured as the particle diameter of the conductive particle.

On the other hand, examples of the material forming the main body portion 8 may include conductive material including conductive particles such as silver (Ag) having a particle diameter set within a range of 3 to 20 μm and a binder resin similar to the aforementioned binder resin. In this case, the particle diameter of the conductive particle included in the material forming the main body portion 8 is relatively large compared to the particle diameter of the conductive particle included in the material forming the lead wire 5. Therefore, the material forming the main body portion 8 is a material having a relatively high electrical resistance compared to the conductive material forming the lead wire 5.

Next, a method of manufacturing the wiring board 1 of one or more embodiments will be described.

Figure 5:
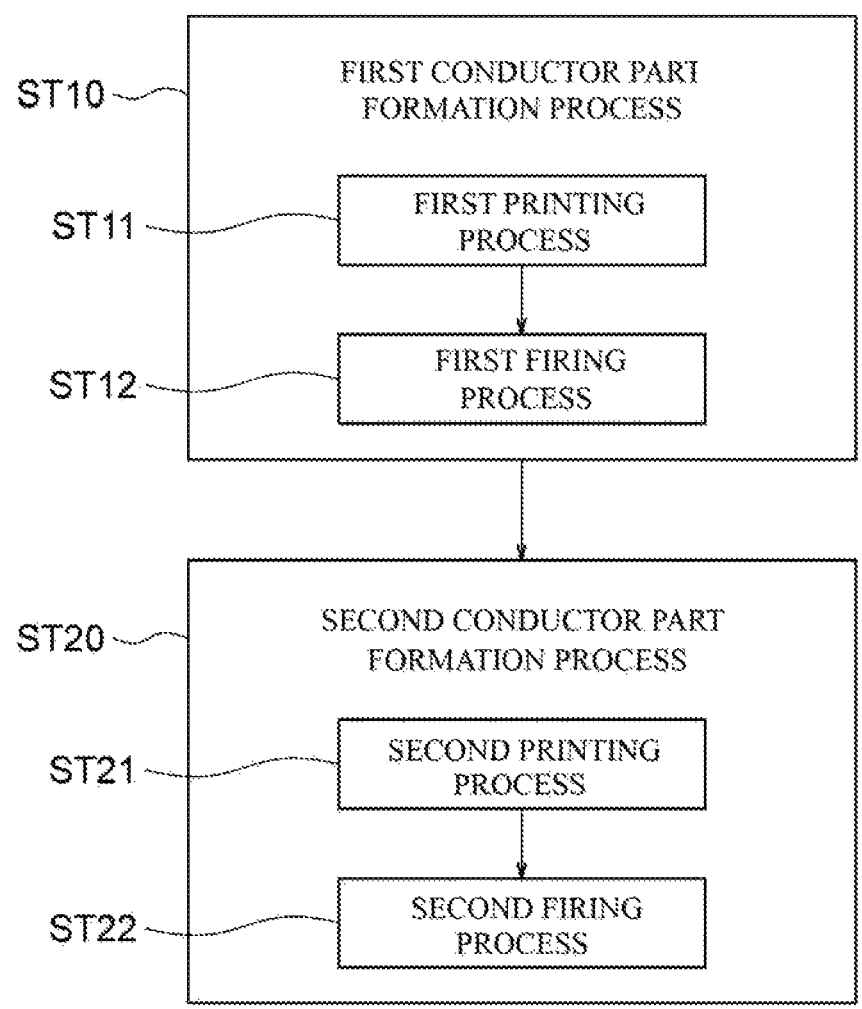
FIG. 5 is a process chart of a method of manufacturing a wiring board according to one or more embodiments of the present invention.
Figure 8:
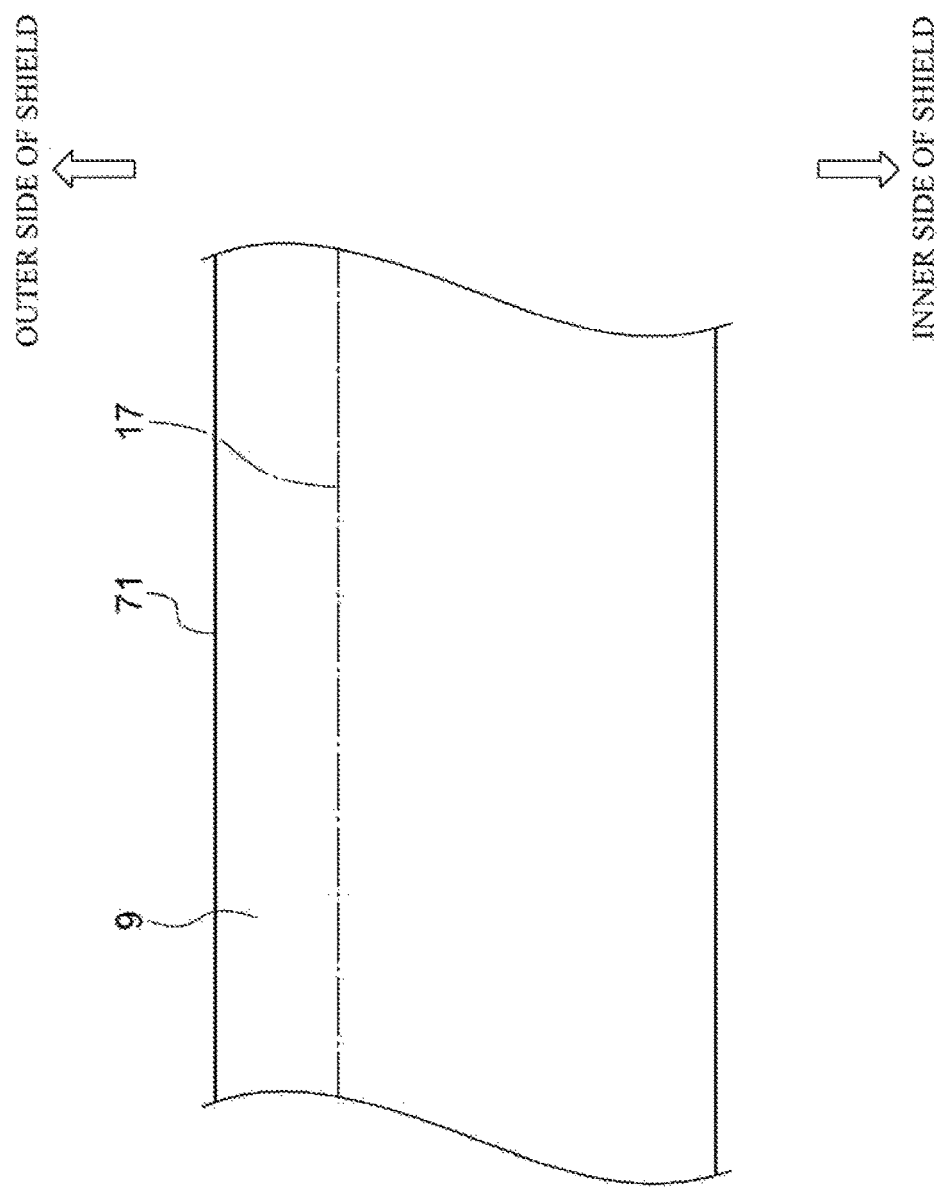
FIG. 8 is a view for explaining a positional relationship between a boundary line and a second print pattern according to one or more embodiments of the present invention.

FIG. 5 is a process chart of a method of manufacturing a wiring board according to one or more embodiments of the present invention, FIGS. 6(*a*) to 6(*c*) are side views for explaining a first printing process according to one or more embodiments of the present invention, FIGS. 7(*a*) to 7(*d*) are side views for explaining a second printing process according to one or more embodiments of the present invention, and FIG. 8 is a view for explaining a positional relationship between the boundary line and the second print pattern according to one or more embodiments of the present invention.

As illustrated in FIG. 5, the method of manufacturing the wiring board 1 of the present embodiment includes a first conductor part formation process ST10 and a second conductor part formation process ST20.

The first conductor part formation process ST10 includes a first printing process ST11 and a first firing process ST12.

In the first printing process ST11 of one or more embodiments, a first print pattern 14 (see FIG. 6(*c*)) is formed on the base 2 by using a gravure offset printing apparatus 100 including a gravure roll 110 (an intaglio plate) illustrated in FIG. 6(*a*). The first print pattern 14 includes patterns corresponding to the electrode 4, the lead wire 5, the terminal 6, as well as the boundary line 9 of the shield 7, the shield lead wire 11, and the shield terminal 12 on the base 2.

In one or more embodiments, the first printing process ST11 is executed using a gravure offset method, but a printing method that may be adopted for the first printing process ST11 is not particularly limited to the gravure offset method as long as the method is a method of applying ink to a printing material using the intaglio plate. For example, a simple offset printing method may be used.

Here, the gravure offset printing apparatus 100 used in the first printing process ST11 will be described. The gravure offset printing apparatus 100 is a device for forming a predetermined pattern on the base 2 by using the gravure offset printing method, and includes a gravure roll 110, a doctor blade 120, a storage unit 130, a transfer roll 140, and a print table 150, as illustrated in FIG. 6(*a*).

The gravure roll 110 includes a plate cylinder 111 and a gravure plate 112. The plate cylinder 111 is formed in a cylindrical shape and can be driven to rotate about its axial center by a motor or the like not specifically illustrated. The gravure plate 112 is wound around an outer circumference of the plate cylinder 111 and has a recessed portion 112*a* formed on its outer circumferential surface so as to correspond to the first print pattern 14. Around the gravure roll 110, there are provided the doctor blade 120 in sliding contact with the gravure plate 112 and a storage unit 130 for storing a first conductive material 13.

Examples of the first conductive material 13 may include a conductive ink or a conductive paste formed by mixing water or solvent, and various additives in addition to the conductive particles and the binder resin which are the materials forming the aforementioned lead wire 5. Examples of the solvent contained in the first conductive material 13 may include α-terpineol, butyl carbitol acetate, butyl carbitol, 1-decanol, butyl cellosolve, diethylene glycol monoethyl ether acetate, tetradecane and the like.

The transfer roll 140 is arranged so as to face the gravure roll 110. The transfer roll 140 includes a blanket cylinder 141 and a blanket 142. The blanket cylinder 141 has a cylindrical shape and can be driven to rotate about its axial center by a motor or the like not specifically illustrated.

The blanket 142 is wound on an outer periphery of the blanket cylinder 141 via an adhesive layer not specifically illustrated. The blanket 142 has a function of accepting the first conductive material 13 from the gravure plate 112 and transferring it to the base 2. Examples of a material forming such a blanket 142 may include silicon rubber, fluororubber, fluorosilicon rubber, urethane rubber, acrylonitrile-butadiene copolymer rubber (NBR), fluororubber, acrylic rubber, chloroprene rubber or the like.

In the first printing process ST11, first, as illustrated in FIG. 6(*a*), the first conductive material 13 is filled in the recessed portion 112*a* of the gravure plate 112. Specifically, the first conductive material 13 continuously adheres to a surface of the gravure plate 112 as the gravure roll 110 rotates about the axis. Then, while the recessed portion 112*a* of the gravure plate 112 is filled with the first conductive material 13, excess conductive material adhering to the surface of the gravure plate 112 is scraped out from gravure plate 112 by the doctor blade 120.

Subsequently, as illustrated in FIG. 6(b), the transfer roll 140 is brought close to the gravure roll 110, and the gravure roll 110 and the transfer roll 140 are rotated together while the gravure plate 112 and the blanket 142 being in contact with each other. As a result, the first conductive material 13 filled in the gravure plate 112 is received by the blanket 142, and the first print pattern 14 corresponding to the recessed portion 112a is formed on the surface of the blanket 142.

Subsequently, as illustrated in FIG. 6(c), the transfer roll 140 is brought close to the base 2 placed on the print table 150 and the blanket 142 is pressed against the base 2, whereby the first print pattern 14 is transferred from the transfer roll 140 to the base 2.

Subsequently, in the first firing process ST12, the base 2 on which the first print pattern 14 is formed is transferred to a drying furnace (not illustrated). In this drying furnace, the first print pattern 14 on the base 2 is heated and cured, whereby the electrode 4, the lead wire 5, the terminal 6, the boundary line 9 of the shield 7, the shield lead wire 11, and the shield terminal 12 are formed on the base 2. Examples of such a drying furnace may include an IR (far infrared) drying furnace, a hot air drying furnace and the like.

In the first firing process ST12, if the first print pattern 14 is cured to such an extent that a second print pattern 17 can be formed in a second printing process ST21 to be described later, the conductor part corresponding to the first print pattern 14 may not be in a completely cured state as described above.

In the following description, the base 2 on which the electrode 4, the lead wire 5, the terminal 6, the boundary line 9 of the shield 7, the shield lead wire 11, and the shield terminal 12 are formed is also referred to as an intermediate body 15.

In one or more embodiments, when the intermediate body 15 is obtained in the first conductor part formation process ST10, as illustrated in FIG. 5, the process proceeds to the second conductor part formation process ST20. The second conductor part formation process ST20 is a process of forming a remaining portion of the shield 7, specifically, a process of forming the main body portion 8 of the shield 7. The second conductor part formation process ST20 includes a second printing process ST21, a second firing process ST22.

First, in the second printing process ST21, the second print pattern 17 (see FIG. 7(c)) is formed on the base 2, using a screen printing apparatus 200 for directly applying a second conductive material 16 to the base 2 illustrated in FIG. 7(a). The second print pattern 17 includes a pattern corresponding to the main body portion 8 of the shield 7.

In one or more embodiments, the second printing process ST21 is executed using a screen printing method (the screen printing apparatus 200), but a printing method that may be adopted in the second printing process ST21 is not particularly limited to the screen printing method as long as the method is a method of directly applying ink to a printing material (a method of applying the ink to a printing material without intervention of the intaglio or the like).

Here, the screen printing apparatus 200 used in the second printing process ST21 will be described. As illustrated in FIG. 7(a), the screen printing apparatus 200 includes a stencil 210, a plate frame 220, a squeegee 230, and a dispenser 240, and a print table 250.

The stencil 210 is a thin sheet-like member and, for example, a metal mask may be used for the stencil 210. The stencil 210 has such a degree of rigidity that the stencil 210 can be deformed by a pressing force applied from a surface direction of a principal surface of the stencil 210. A hole 211 penetrating both the main surfaces of the stencil 210 is formed in the stencil 210. The hole 211 corresponds to the second print pattern 17.

A peripheral edge portion of the stencil 210 is fixed to the plate frame 220. The plate frame 220 has an opening 221 corresponding to a formation region of the hole 211 formed in the stencil 210. In the screen printing apparatus 200, the print table 250 on which the base 2 can be placed, and the formation region of the hole 211 face each other through the opening 221 of the plate frame 220 in the plan view. The squeegee 230 has a width corresponding to the formation region of the hole 211 of stencil 210, and can slide on the main surface opposite to the main surface of the stencil 210 on a side facing the base 2.

The dispenser 240 is a device for supplying the second conductive material 16 onto the stencil 210. The dispenser 240 is arranged to face the main surface opposite to the main surface of the stencil 210 on the side facing the base 2.

Examples of the second conductive material 16 may include a conductive ink or a conductive paste formed by mixing water or solvent and various additives in addition to the conductive particles and the binder resin which are the materials forming the aforementioned main body portion 8. As the solvent contained in the second conductive material 16, solvent which is the same as that contained in the first conductive material 13 may be used.

In the second conductor part formation process ST20, first, as the second printing process ST21, the stencil 210 is set so as to face the intermediate body 15, as illustrated in FIG. 7(a). At this time, the stencil 210 is disposed in a state of being separated from an upper surface of the intermediate body 15 by a predetermined distance. Then, the second conductive material 16 is supplied onto the stencil 210 by the dispenser 240.

Then, as illustrated in FIG. 7(b), the squeegee 230 to which a predetermined pressure is applied is pressed against the stencil 210 from above the stencil 210. The stencil 210 is deformed as it bends downward by a pressing force from the squeegee 230. Immediately below the squeegee 230, the stencil 210 closely contacts the intermediate body 15, and the second conductive material 16 passes through the hole 211 of the stencil 210 due to an internal pressure of the second conductive material 16 generated by sliding of the squeegee 230, thus adhering onto the intermediate body 15 (see FIG. 7(c)). As a result, the second print pattern 17 is formed on the intermediate body 15.

At this time, the second print pattern 17 is formed at an inner side compared to the outline 71 of the shield 7 in the plan view. Further, the second print pattern 17 is formed so as to overlap the boundary line 9 in the plan view.

In a state immediately after the second print pattern 17 is formed on the intermediate body 15, since the second conductive material 16 forming the second print pattern 17 still has a high fluidity, it tends to wet-spread over time. In contrast, in one or more embodiments, when the boundary line 9 is formed so as to correspond to the outline 71, the boundary line 9 impedes a flow of the second print pattern 17, suppressing the second print pattern 17 from wet-spreading over the outline 71 of the shield 7.

Further, in one or more embodiments, the outline 71 of the second print pattern 17 is formed so as to overlap with the boundary line 9 in the plan view, whereby the boundary line 9 may be brought into close contact with the main body portion 8 formed of the second print pattern 17. In this case, it is possible to suppress generation of a gap in the shield 7 including the main body portion 8 and the boundary line 9.

After forming the second print pattern 17 on the intermediate body 15, the squeegee 230 is withdrawn from the stencil 210 as illustrated in FIG. 7(d). Since the pressing force received from the squeegee 230 is removed, the stencil 210 deforms to return to its original shape. As a result, the stencil 210 is separated from the intermediate body 15.

Subsequently, in the second firing process ST22, the intermediate body 15 on which the second print pattern 17 is formed is transferred to the drying furnace (not illustrated). In the drying furnace, the second print pattern 17 on the base 2 is heated and cured, whereby the main body portion 8 of the shield 7 is formed on the base 2. Thus, the wiring board 1 can be obtained. The drying furnace used in the second firing process ST22 may be the same as the drying furnace used in the first firing process ST12. In FIG. 7(d), the wiring board obtained by passing through the drying furnace is indicated by reference numeral "1."

The wiring board 1 and the method for manufacturing the wiring board in one or more embodiments have the following effects.

In the related-art wiring board including a conductor part including at least a fine line and a thick line which is wider than the fine line, the ink tends to blur around the thick line and it may be mixed with the fine line adjacent to the thick line when the fine line and the thick line are formed by printing at once.

In contrast, in the wiring board 1 of one or more embodiments including the lead wire 5 which is a fine wire and the shield 7 which is a thick line wider than the lead wire 5, after the lead wire 5 and the boundary line 9 of the shield 7 are formed first, the main body portion 8 which is the remaining portion of the shield 7 is formed. In this case, even if the second print pattern 17 corresponding to the main body portion 8 tends to wet-spread over time, a flow of the second conductive material 16 is inhibited due to the influence of a height of the boundary line 9, a surface roughness of the boundary line 9, or the like. Thus, the wet spreading of the second print pattern 17 is suppressed. As a result, particularly, it is possible to suppress the shield 7 and the lead wire 5a adjacent to the shield 7 from being mixed with each other.

In one or more embodiments, the gravure offset printing method, which is a printing method using a relatively high precision intaglio plate, is used in the first conductor part formation process ST10 where the lead wire 5 and the boundary line 9 are formed, while the screen printing method, which is a printing method of directly applying the ink, is used in the second conductor part formation process ST20 where the main body portion 8 is formed. This is due to the following reason. That is, although the shield is a wide portion, when the recessed portion of the gravure plate which is an intaglio plate corresponding to the shield is formed, there is a possibility that the conductive material filled in the recessed portion is excessively scraped out during doctoring by the doctor blade. In this case, the height of the shield may decrease and, if the shield is fired in this state, pinholes frequently occur and a quality of the shield may deteriorate.

Therefore, in one or more embodiments, the boundary line 9 of the shield 7 is formed by using the gravure offset printing method which is a printing method using the gravure plate 112 in the first conductor part formation process ST10, and then, the main body portion 8 of the wide shield 7 is formed by using the screen printing method which is a printing method of directly applying the ink to the printing object in the second conductor part formation process ST20, thereby suppressing the quality of the shield 7 from deteriorating due to the frequent occurrence of pinholes.

Further, in one or more embodiments, the outline 81 of the main body portion 8 is formed so as to overlap with the boundary line 9 in the plan view, whereby it is possible to bring the boundary line 9 and the main body portion 8 into close contact with each other. In this case, it is possible to suppress generation of a gap in the shield 7 including the main body portion 8 and the boundary line 9.

In the case of forming the main body portion 8 so as to overlap the boundary line 9, a variation in the precision of overlapping printing in the second printing process ST21 becomes a problem, but the variation in the precision of the overlapping printing in the second printing process ST21 is permitted by the width $W_4$ of the boundary line 9 in one or more embodiments. Therefore, unlike the related art, a high-precision overlapping printing is not necessary in the second printing process ST21 of one or more embodiments.

Further, in one or more embodiments, the relationship between the width $W_1$ of the lead wire 5 and the width $W_2$ of the boundary line 9 is set such that the aforementioned Formula (5) is established, whereby it is possible to further suppress wet spreading of the second print pattern 17 in the second printing process ST21.

Further, in one or more embodiments, the aforementioned Formula (6) is established, whereby it is possible to suppress the occurrence of pinholes in the shield 7. Further, since a conduction path can be increased in the main body portion 8, a conductivity of the shield 7 can be improved.

Further, in one or more embodiments, the material forming the main body portion 8 has a composition different from those of the material forming the lead wire 5 and the boundary line 9. Thus, the material forming the main body portion 8 which greatly contributes to the conductivity of the shield 7 is arbitrarily selected, whereby it is possible to adjust an electrical resistance of the entire shield 7.

Further, in one or more embodiments, an electrical resistance of the material forming the main body portion 8 is relatively high compared to an electrical resistance of the material forming the lead wires 5 and the boundary line 9. If the entire shield 7, which is the thick line, is made of the material having a low electrical resistance that forms the lead wires 5 and the boundary line 9, the electrical resistance of the entire shield 7 is excessively lowered, making it difficult to exhibit a shielding performance (conduction performance) suitable for the environment in some cases. In contrast, as in one or more embodiments, a material having a high electrical resistance is selected as the material forming the main body portion 8, whereby it is possible to suppress an excessive decrease in the electrical resistance of the entire shield 7 which is the thick line. This makes it possible to keep the electrical resistance of the entire shield 7 in a predetermined range, exhibiting the shielding performance (conduction performance) suitable for the environment.

In one or more embodiments, the boundary line 9 is formed by a single linear pattern. However, in order to suppress the wet spreading of the second print pattern 17 corresponding to the main body portion 8, the boundary line 9 may be formed by a plurality of (for example, two) linear patterns 91 and 92 extending adjacent to each other. Embodiments in which the boundary line 9 is formed by a plurality of linear patterns 91 and 92 will be described below.

Figure 9:
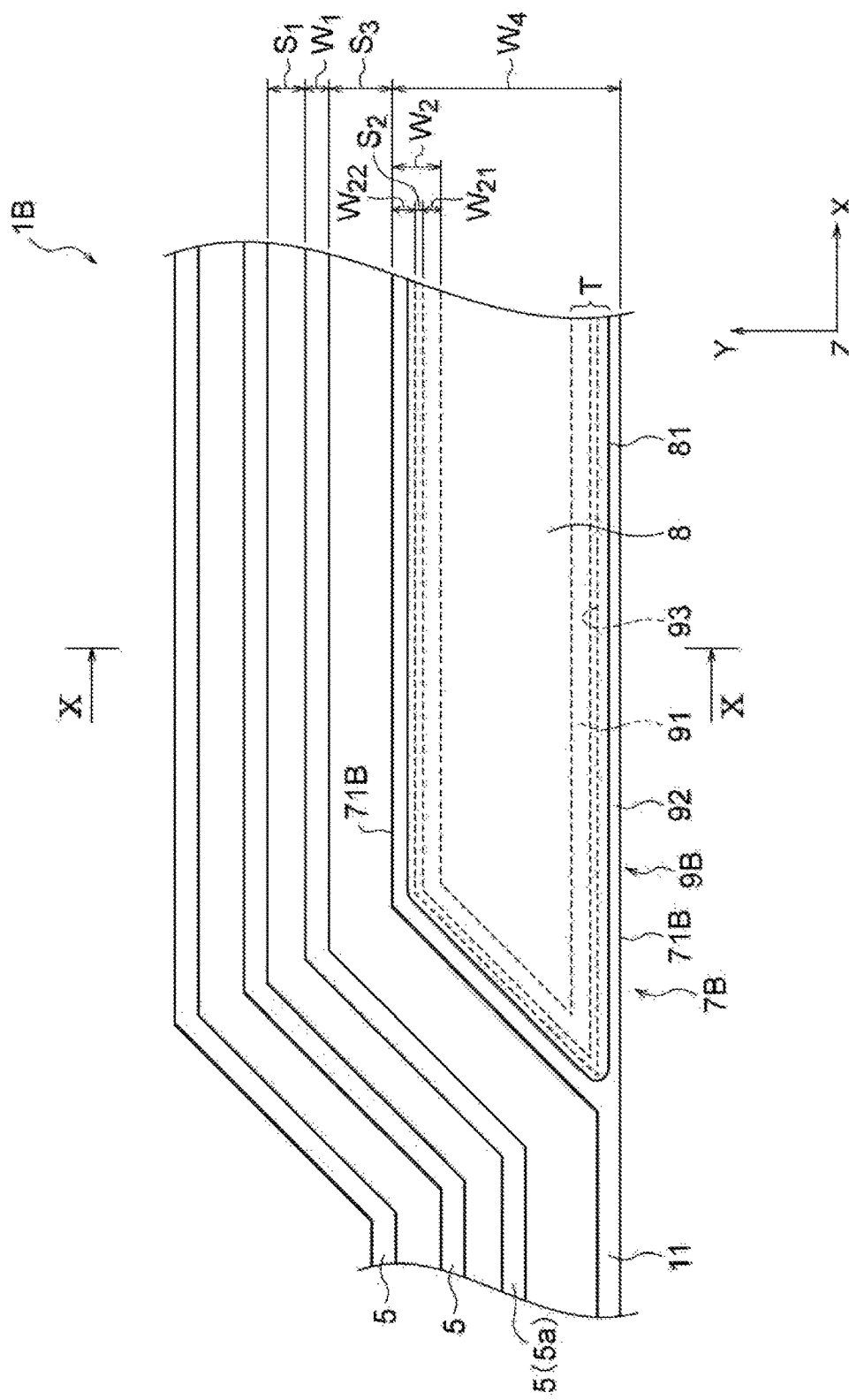
FIG. 9 is a view illustrating a wiring board according to one or more embodiments of the present invention and is a plan view corresponding to FIG. 2.
Figure 10:
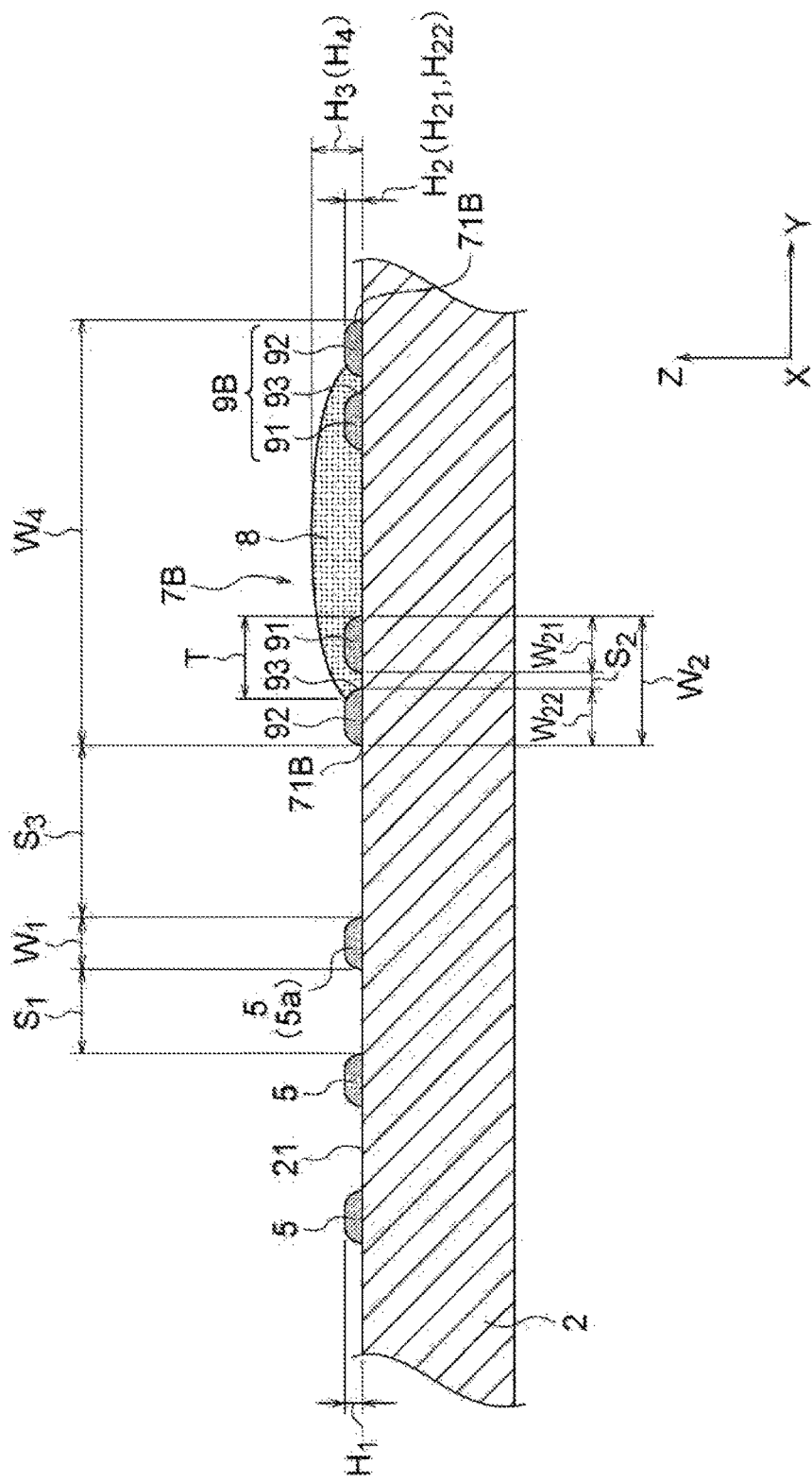
FIG. 10 is a cross-sectional view taken along a line X-X in FIG. 9.
Figure 11:
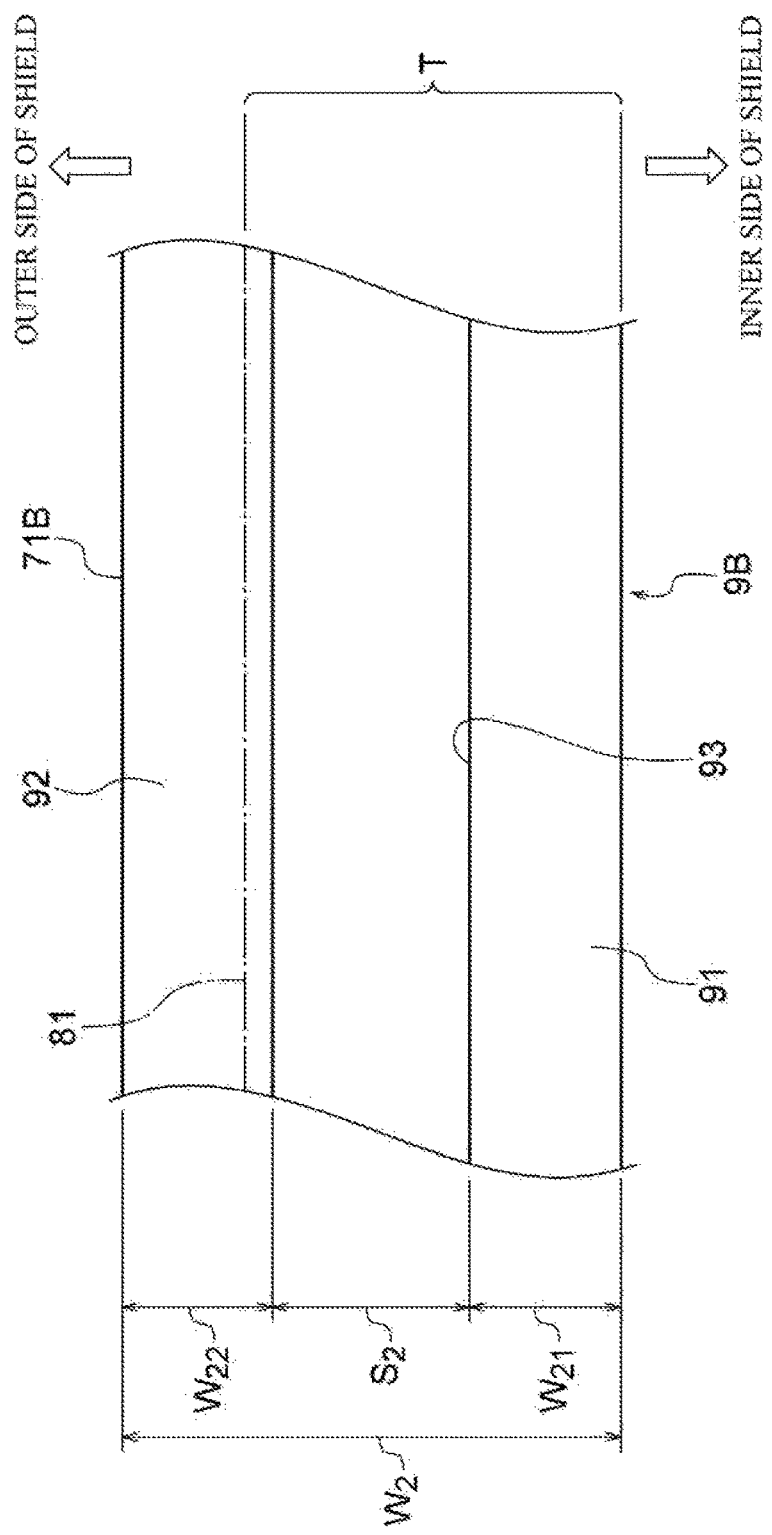
FIG. 11 is a plan view for explaining a positional relationship between a boundary line and a main body portion according to one or more embodiments of the present invention.

FIG. 9 is a view illustrating a wiring board according to one or more embodiments of the present invention, which is a plan view corresponding to FIG. 2, FIG. 10 is a sectional view taken along a line X-X of FIG. 9, and FIG. 11 is a plan view for illustrating a positional relationship between a boundary line and a main body portion according to one or more embodiments of the present invention.

In the following one or more embodiments, a configuration of a boundary line 9B is different from that of the boundary line 9 of the previously-described embodiments, but the other configuration may be the same. Hereinafter, with respect to a shield 7B according to one or more embodiments, only differences from the shield of the previously-described embodiments will be described, and the same reference numerals are given to parts having the same configuration as in the previously-described embodiments, and description thereof will be omitted.

As illustrated in FIGS. 9 and 10, the boundary line 9B of one or more embodiments includes two first and second linear patterns 91 and 92 extending adjacent to each other. The "first and second linear patterns 91 and 92" correspond to an example of the "linear pattern" in one or more embodiments of the present invention.

In one or more embodiments, the first and second linear patterns 91 and 92 are also formed continuously so as to correspond to the entire outline 71B in line with the feature that the boundary line 9B is continuously formed so as to correspond to the entire outline 71B of the shield 7B in the plan view. These first and second linear patterns 91 and 92 are arranged adjacent to each other to extend with a substantially constant width in their extending direction.

The first linear pattern 91 is located at an inner side compared to the second linear pattern 92 in the plan view. These first and second linear patterns 91 and 92 are spaced apart by a predetermined gap. Thus, a slit 93 is formed between the first and second linear patterns 91 and 92 of one or more embodiments.

The slit 93 is a gap interposed between the first and second linear patterns 91 and 92 in the plan view, and is formed continuously along the extending direction of the first and second linear patterns 91 and 92. According to one or more embodiments, the base 2 is exposed from the boundary line 9B in a region where the slit 93 is formed. The main body portion 8 is entered in the slit 93, and the base 2 exposed from the boundary line 9B at the slit 93 directly contacts the main body portion 8.

Widths $W_{21}$ and $W_{22}$ of the first and second linear patterns 91 and 92 are set within a range of 30 to 100 μm. In addition, heights $H_{21}$ and $H_{22}$ of the first and second linear patterns 91 and 92 are set within a range of 1 to 10 μm.

In a relationship between the widths $W_{21}$ and $W_{22}$ of the first and second linear patterns 91 and 92, the width $W_{21}$ of the first linear pattern may be relatively large compared to the width $W_{22}$ of the second linear pattern 92 ($W_{21}>W_{22}$) or the width $W_{22}$ of the second linear pattern 92 may be relatively large compared to the width $W_{21}$ of the first linear pattern 91 ($W_{21}<W_{22}$). Alternatively, the widths $W_{21}$ and $W_{22}$ of the first and second linear patterns 91 and 92 may be the same ($W_{21}=W_{22}$).

Further, in the relationship between the widths $W_{21}$ and $W_{22}$ of the first and second linear patterns 91 and 92 and the width $W_1$ of the lead wire 5, the widths $W_{21}$ and $W_{22}$ of the first and second linear patterns 91 and 92 may be larger than the width $W_1$ of the lead wire 5 ($W_{21}$, $W_{22}>W_1$) or the widths $W_{21}$ and $W_{22}$ of the first and second linear patterns 91 and 92 may be smaller than the width $W_1$ of the lead wire 5 ($W_{21}$, $W_{22}<W_1$). Alternatively, the widths $W_{21}$ and $W_{22}$ of the first and second linear patterns 91 and 92 and the width $W_1$ of the lead wire 5 may be the same ($W_{21}$, $W_{22}=W_1$). In either case, a relationship between the width $W_2$ of the boundary line 9B and the width $W_1$ of the lead wire 5 is set so as to satisfy the Formula (5).

In a relationship between the heights $H_{21}$ and $H_{22}$ of the first and second linear patterns 91 and 92, the height $H_{21}$ of the first linear pattern 91 may be relatively large compared to the height $H_{22}$ of the second linear patterns 92 ($H_{21}>H_{22}$) or the height $H_{22}$ of the second linear pattern 92 may be relatively large compared to the height $H_{21}$ of the first linear pattern 91 ($H_{21}<H_{22}$). Alternatively, the heights $H_{21}$ and $H_{22}$ of the first and second linear patterns 91 and 92 may be the same ($H_{21}=H_{22}$).

On the other hand, a width $S_2$ of the slit 93 is set within a range of 20 to 50 μm. For this case, in one or more embodiments, a relationship between the widths $W_{21}$ and $W_{22}$ of the first and second linear patterns 91 and 92 and the width $S_2$ of the slit 93 is set so as to satisfy the following Formula (7).

$$W_{21}, W_{22} > S_2 \qquad (7)$$

When the widths $W_{21}$ and $W_{22}$ of the first and second linear patterns 91 and 92 are different from each other, either one of the widths $W_{21}$ and $W_{22}$ of the first and second linear patterns 91 and 92 which is smaller than the other is compared with the width $S_2$ of the slit 93.

An aspect of the boundary line 9B is not particularly limited to the aforementioned configuration. For example, a plurality of slits may be formed intermittently between the first and second linear patterns 91 and 92, along the extending direction of the first and second linear patterns 91 and 92. In this case, lengths of adjacent slits (the length in the extending direction of the slit) may be the same or may be different from each other. Further, intervals between adjacent slits may be the same or may be different from each other.

Further, in one or more embodiments, the boundary line 9B is formed by two linear patterns 91 and 92. However, the present invention is not particularly limited thereto, and the boundary line 9B may be formed by three or more linear patterns. In this case, intervals (that is, the widths of the slits) between the adjacent linear patterns may be the same or may be different from each other.

In a case where the boundary line is formed by a plurality of linear patterns, the height $H_2$ of the boundary line corresponds to a height of the largest linear pattern among the plurality of linear patterns. In addition, when the boundary line is formed by a plurality of linear patterns, the width of the boundary line $W_2$ corresponds to a length between an inner side part of the inner linear pattern located on the innermost side and an outer side part of the linear pattern located on the outermost side in a direction substantially perpendicular to the extending direction of the boundary line in the plan view.

As illustrated in FIGS. 9 to 11, the main body portion 8 of one or more embodiments is formed so as to overlap the entire first linear pattern 91 of the boundary line 9B and overlap a part of the second linear pattern 92 of the boundary line 9B so as to overlap with a part thereof in the plan view. In this case, the main body portion 8 is entered in the slit 93 of the boundary line 9B. As a result, the first and second linear patterns 91 and 92 are electrically connected to each other via the main body portion 8.

The wiring board 1B of one or more embodiments has the following effects.

The wiring board 1B in one or more embodiments can also obtain the same operational effects as those of the wiring board 1.

Further, in one or more embodiments, the boundary line 9B includes first and second linear patterns 91 and 92 extending adjacent to each other. In this case, it is possible to form the boundary line 9B to be relatively wide while suppressing occurrence of pinholes even in the boundary line 9B. In one or more embodiments, the slit 93 is formed between the first and second linear patterns 91 and 92. Therefore, the second print pattern 17 corresponding to the main body portion 8 is entered in the slit 93, whereby it is possible to further suppress the wet spreading of the second print pattern 17 and to prevent the main body portion 8 from crossing the boundary line 9B and being mixed with the lead wire 5a.

Figure 12:
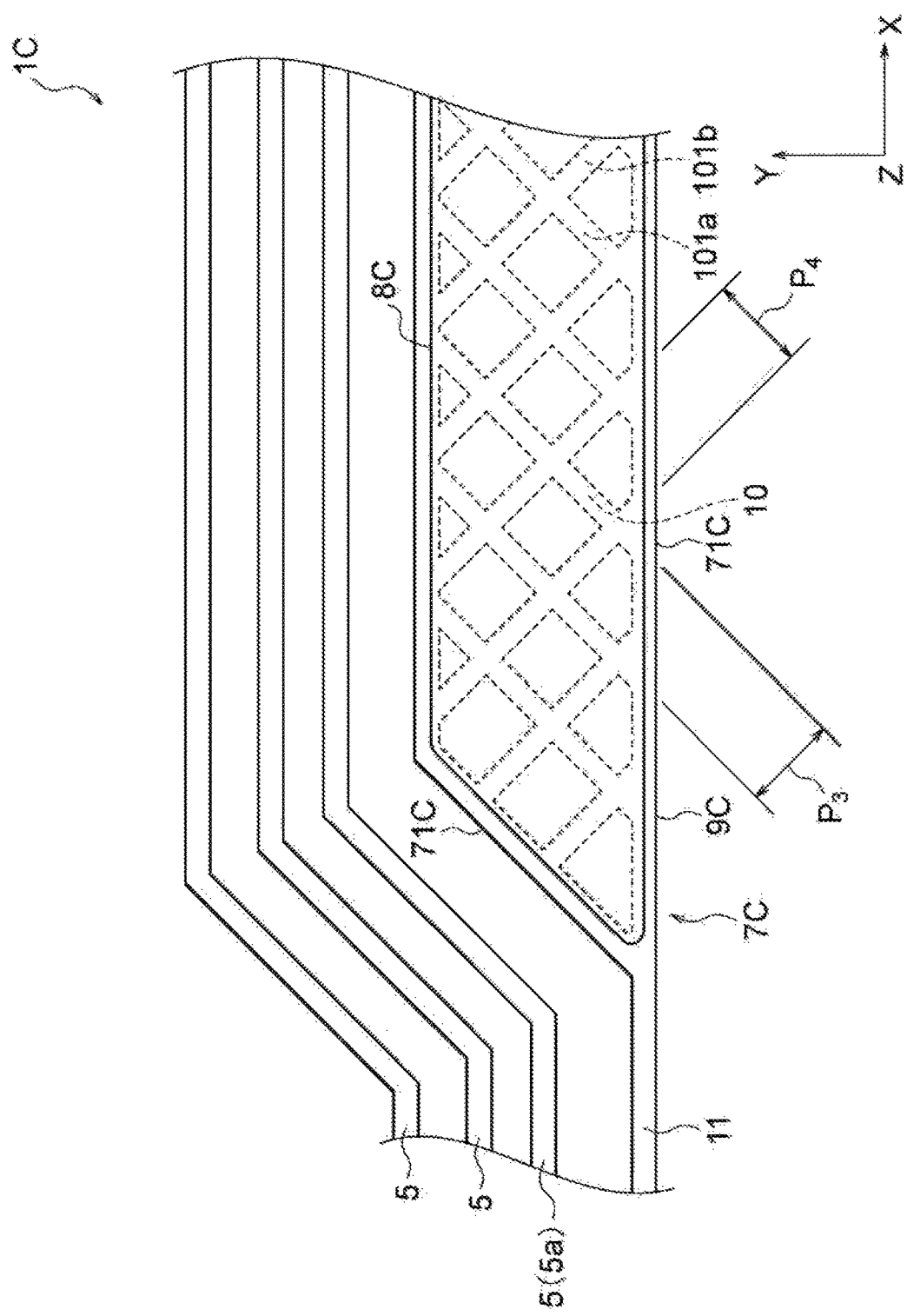
FIG. 12 is a diagram illustrating a wiring board according to one or more embodiments of the present invention, and is a plan view corresponding to FIG. 2.

FIG. 12 is a view illustrating a wiring board according to one or more embodiments of the present invention, and is a plan view corresponding to FIG. 2.

In one or more embodiments, a shield 7C is different from the shield of the previously-described embodiments in that it has a mesh portion 10 surrounded by an outline 71C of the shield 7C, but other configurations are the same as those in the previously-described embodiments. Hereinafter, only the differences between the shield 7C will be explained, and the same reference numerals are given to the parts having the same configuration as in the previously-described embodiments, and the explanation will be omitted.

As illustrated in FIG. 12, the shield 7C of the wiring board 1C has a mesh portion 10 surrounded by the outline 71C of the shield 7C. The "mesh portion 10" in this example corresponds to an example of the "mesh portion" in one or more embodiments of the present invention.

The mesh portion 10 has a mesh shape formed by intersecting a plurality of mesh fine lines 101a and 101b. The mesh fine lines 101a extend linearly along a first direction, and a plurality of mesh fine lines 101a are arranged at an equal pitch $P_3$ in the second direction. In contrast, the mesh fine lines 101b extend linearly along the second direction, and a plurality of mesh fine lines 101b are arranged at an equal pitch $P_4$ in the first direction. Since the mesh fine lines 101a and 101b are orthogonal to each other, the mesh portion 10 is formed in the mesh shape where a rectangular mesh is repeated.

The configuration of the mesh portion 10 is not particularly limited to the aforementioned configuration as in the case with the configuration of the electrode 4 described above. Further, in one or more embodiments, an extending direction of the mesh fine lines 101a of the mesh portion 10 coincides with an extending direction of the electrode fine wires 41a of the electrode 4, and an extending direction of the mesh fine lines 101b coincide with an extending direction of the electrode fine wires 41b. However, the present invention is not limited the aforementioned configuration, and the lines may extend in different directions.

The main body portion 8C is formed so as to overlap the entire mesh portion 10 in the plan view. In the relationship between the height of the main body portion 8C and the height of the mesh fine lines 101a and 101b forming the mesh portion 10, the height of the mesh fine lines 101a and 101b may be relatively large compared to the height of the main body portion 8C, and the height of the mesh fine lines 101a and 101b may be relatively small compared to the height of the main body portion 8C. Alternatively, the height of the mesh fine lines 101a and 101b and the height of the main body portion 8C may be the same.

Material forming such a mesh portion 10 has a composition which is the same as that of the material forming the lead wire 5. According to a manufacturing method of the wiring board 1C, the mesh portion 10 is formed in a first conductor part formation process ST10. However, the present invention is not particularly limited to the aforementioned configuration, and the mesh portion 10 may be formed in a process different from the first conductor part formation process ST10 as long as it is formed before a second conductor part formation process ST20.

When the shield 7C has a mesh portion 10 as in the present example, it is possible to improve a conductivity of the shield 7C compared to a case where the shield does not have a mesh portion 10. Therefore, in the present example, it is possible to adopt a material having a high electrical resistance (low conductivity) compared to the case of not including the mesh portion 10, as the material forming the main body portion 8C.

In general, the conductive material tends to be more expensive as its electrical resistance is lower (as its conductivity is higher), and less expensive as its electrical resistance is higher (as its conductivity is lower). In the present example, the mesh portion 10 is provided in the shield 7C, whereby it is intended to improve the conductivity of the shield 7C while adopting a relatively inexpensive material for the material forming the main body portion 8C, thereby reducing a manufacturing cost of the wiring board 1C.

Examples of such material forming the main body portion 8C may include conductive material containing carbon (C) particles having a particle diameter set within a range of 0.1 to 1 μm and binder resin. The binder resin is the same as that described above. In this case, the particle diameter of the carbon particles contained in the material forming the main body portion 8C is relatively small compared to the particle diameter of the conductive particles contained in the material forming the lead wire 5.

The wiring board 1C according to one or more embodiments has the following effects.

The wiring board 1C in one or more embodiments can also obtain operational effects which are the same as those obtained by the wiring board 1 of one or more embodiments.

Further, in one or more embodiments, the mesh portion 10 is provided on the shield 7C, whereby it is possible to improve a conductivity of the shield 7C while adopting a relatively inexpensive material as the material forming the main body portion 8C, thus reducing a manufacturing cost of the wiring board 1C.

The aforementioned embodiments are described for easy understanding of the present invention and are not described for limiting the present invention. Therefore, each element disclosed in the aforementioned embodiments includes all design changes and equivalents belonging to the technical scope of the present invention.

Figure 13:
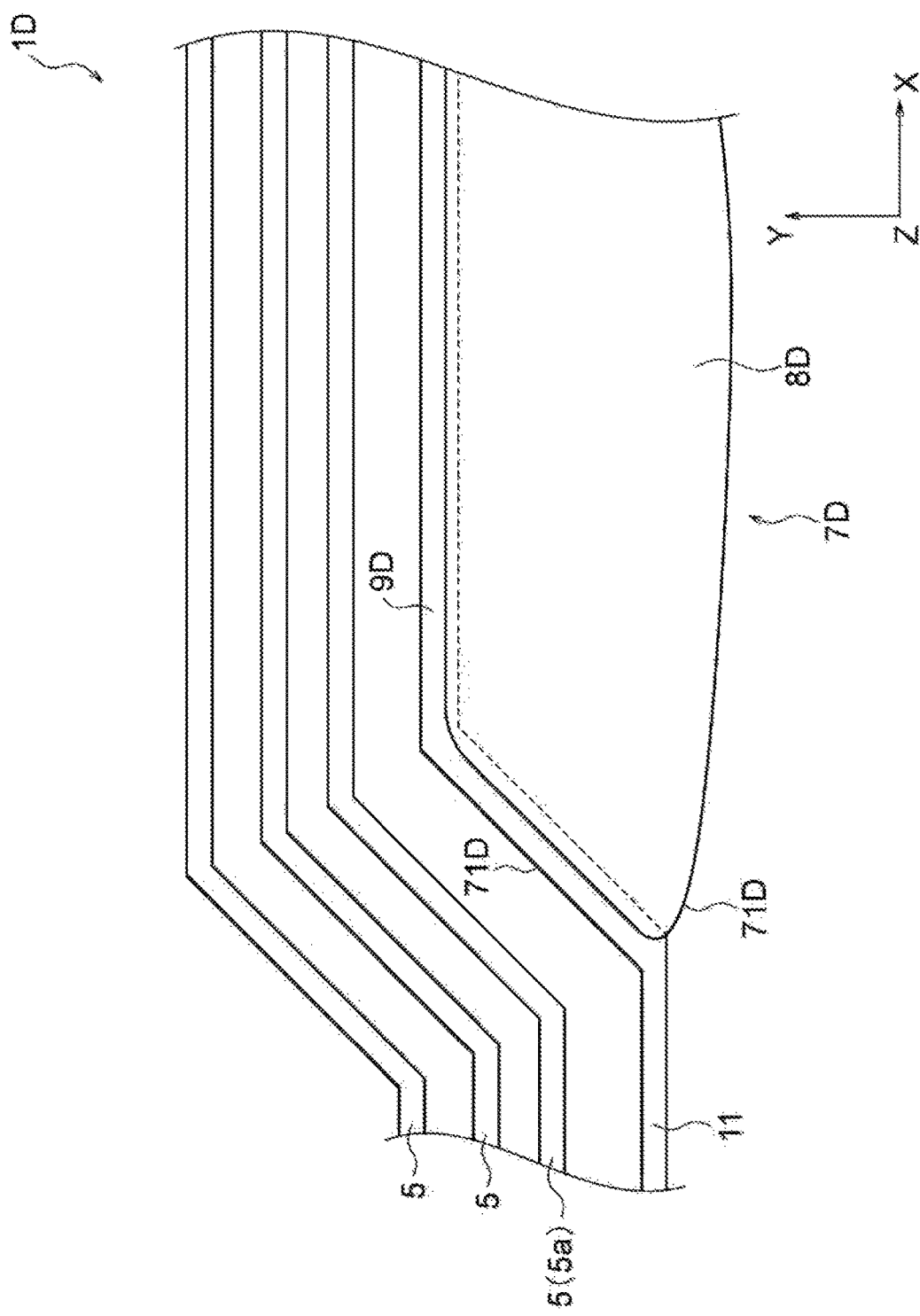
FIG. 13 is a view illustrating a modified example of the wiring board according to one or more embodiments of the present invention, and is a plan view corresponding to FIG. 2.

For example, as the wiring board 1D illustrated in FIG. 13, the shield 7D may have a boundary line 9D corresponding only to a portion of an outline 71D of the shield 7D close to the lead wire 5a. In this case, the outline 71D of the shield 7D is formed by the main body portion 8D in a region where the boundary line 9D is not formed.

That is, the boundary line 9D is formed by at least a part of the outline 71D of the shield 7D. For this case, in the wiring board 1D, the body portion 8D is arranged on one side with respect to the boundary line 9D and the lead wire 5a is arranged on the opposite side of the main body portion 8D in the plan view. When the main body portion 8D is formed, the boundary line 9D may suppress the main body portion 8D from wet-spreading toward the lead wire 5a.

In this example, since the boundary line 9D is formed so as to correspond only to a part of the outline 71D of the shield 7D, the manufacturing cost of the wiring board 1D is relatively inexpensive. Further, since the boundary line 9D is formed to so as to correspond to the portion of the outline 71D of the shield 7D close to the lead wire 5a, it is possible to suppress the shield 7D and the lead wire 5a adjacent thereto from being mixed with each other.

In the aforementioned embodiments, the conductor part 3 is directly formed on the upper surface 21 of the base 2, but the present invention is not particularly limited thereto. For example, a resin layer may be interposed between the base 2 and the conductor part 3.

The wiring board including the resin layer interposed between the base 2 and the conductor part 3 can be manufactured by the following method. That is, at first, an intaglio plate having a concave portion corresponding to the shape of the conductor part 3 (specifically, the electrode 4, the lead wire 5, the terminal 6, the boundary line 9, the shield lead wire 11, and the shield terminal 12) excluding the main body portion 8 is filled with the conductive material. Then, the conductive material is cured while being filled in the concave portion, and the conductor part 3 excluding the main body portion 8 is formed. Then, the intaglio plate is pressed against the base 2 in a state where the resin material forming the resin layer is interposed between the base 2 and the intaglio plate filled with the conductive material. Then, the resin material is cured to form a resin layer. Then, the base 2, the conductor part 3 excluding the main body portion 8, and the resin layer are integrally peeled off from the intaglio plate. Then, the main body portion 8 is formed. This method of forming the main body portion 8 uses a method similar to those described in the aforementioned embodiments. A method of manufacturing the wiring board including the resin layer interposed between the base 2 and the conductor part 3 is not particularly limited to the aforementioned configuration. For example, timing of curing the conductive material is not particularly limited to the aforementioned configuration, and the conductive material may be cured after the base 2, the conductive material, and the resin layer are integrally peeled off from the intaglio plate. Further, in the method of manufacturing the wiring board, a process of curing the resin material is not an indispensable process and may be omitted. For example, the intaglio plate may be pressed against the base while a resin material having a low flowability such as a resin sheet is disposed between the base 2 and the intaglio plate in advance.

In the aforementioned embodiments, the thick line having the main body portion 8 and the boundary line 9 is used as the shield 7, but the present invention is not particularly limited thereto. For example, the thick line may be used as the lead wire. In the wiring board including a plurality of lead wires including fine lines and thick lines, an electrical resistance of the lead wire formed by the thick line can be made lower than the electrical resistance of the lead wire formed by the fine line. This makes it possible to adjust electrical resistances between a plurality of lead wires. Further, the electric resistance of the material forming the main body portion of the thick line may be set to be relatively high compared to the electric resistance of the material forming the fine wire, whereby it is possible to suppress an excessive reduction in the electric resistance of the entire thick line and maintain the electrical resistance within a predetermined range, thus adjusting the electrical resistances among a plurality of lead wires including the fine lines and the thick lines more reliably.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS 1, 1B, 1C, 1D . . . wiring board
2 . . . base
21 . . . upper surface
3 . . . conductor part
4 . . . electrode
41a, 41b . . . electrode fine wire
5 . . . lead wire
5a . . . lead wire
6 . . . terminal
7, 7B, 7C, 7D . . . shield
71, 71B, 71C, 71D . . . outline
8, 8C, 8D . . . main body portion
81 . . . outline
9, 9B, 9C, 9D . . . boundary line
91 . . . first linear pattern
92 . . . second linear pattern
93 . . . slit
10 . . . mesh portion
101a, 101b . . . mesh fine line
T . . . overlapping portion
11 . . . shield lead wire
12 . . . shield terminal
13 . . . first conductive material
14 . . . first print pattern
15 . . . intermediate body
16 . . . second conductive material
17 . . . second print pattern
100 . . . gravure offset printing apparatus
110 . . . gravure roll
111 . . . plate cylinder
112 . . . gravure plate
112a . . . recessed portion
120 . . . doctor blade
130 . . . storage unit
140 . . . transfer roll
141 . . . blanket cylinder
142 . . . blanket
150 . . . print table
200 . . . screen printing apparatus
210 . . . stencil
211 . . . hole
220 . . . plate frame
221 . . . opening
230 . . . squeegee
240 . . . dispenser
250 . . . print table

The invention claimed is:

1. A method of manufacturing a wiring board that comprises a base and a conductor part that is disposed on the base and that includes a first line and a second line wider than the first line, the method comprising:
   forming the conductor part by:
      a first process of forming, on the base, the first line and at least a portion of an outline of the second line near the first line; and
      a second process of forming, on the base, a remaining portion of the second line,
   wherein the first line and the second line are adjacent to and insulated each other, and
   wherein the second process is performed after the first process.

2. The method of manufacturing the wiring board according to claim 1,
   wherein the first line, the portion of the outline, and the remaining portion satisfy the following Formula (1):

$$H_2 < H_3 \tag{1}$$

wherein $H_2$ is a height of the portion of the outline and $H_3$ is a height of the remaining portion in the Formula (1).

3. The method of manufacturing the wiring board according to claim 1, wherein the second process includes overlapping a part of the remaining portion of the second line with the portion of the outline in plan view.

4. The method of manufacturing the wiring board according to claim 1, wherein the portion of the outline corresponds to the whole of the outline.

5. The method of manufacturing the wiring board according to claim 1, wherein the first line and the portion of the outline satisfy the following Formula (2):

$$W_1 < W_2 \tag{2}$$

and wherein $W_1$ is a width of the first line and $W_2$ is a width of the portion of the outline in the Formula (2).

6. The method of manufacturing the wiring board according to claim 1, wherein the portion of the outline includes linear patterns extending adjacent to each other.

7. The method of manufacturing the wiring board according to claim 1,
wherein the second line includes a mesh portion surrounded by the outline and formed into a mesh shape, and
the method of manufacturing the wiring board further comprises forming the mesh portion before the second process.

\* \* \* \* \*